(12) United States Patent
Niimi et al.

(10) Patent No.: US 6,194,282 B1
(45) Date of Patent: Feb. 27, 2001

(54) METHOD FOR STABILIZING SOI SEMICONDUCTOR DEVICE AND SOI SEMICONDUCTOR DEVICE

(75) Inventors: Kenichi Niimi, Tenri; Alberto Oscar Adan, Ikoma, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/511,116

(22) Filed: Feb. 23, 2000

(30) Foreign Application Priority Data

May 31, 1999 (JP) .................................................. 11-152124

(51) Int. Cl.$^7$ ..................................................... H01L 21/76
(52) U.S. Cl. ................................................................ 438/404
(58) Field of Search ..................................... 438/404, 403, 438/311, 800, 412, 405–411, 795

(56) References Cited

FOREIGN PATENT DOCUMENTS 9-8259    6/1995 (JP) .

OTHER PUBLICATIONS

Terukazu Ohno, et al., IEEE. SSDM. Tech. Dig., 1995, "Suppression of the Parasitic Bipolar Effect . . . ", pp. 627–630.

Primary Examiner—Charles Bowers
Assistant Examiner—Craig Thompson
(74) Attorney, Agent, or Firm—Nixon & Vanderhye, P.C.

(57) ABSTRACT

A method for stabilizing an SOI semiconductor device which comprises the steps of: providing an SOI semiconductor device constituted of an SOI substrate including a support substrate, a buried insulating film formed on the support substrate and a surface semiconductor layer formed on the buried insulating film, source/drain regions formed in the surface semiconductor layer and a gate electrode formed on the surface semiconductor layer between the source/drain regions with intervention of a gate insulating film; and applying an electric stress between the support substrate and one of the source/drain regions so that a back channel is formed in a side of the surface semiconductor layer to the buried insulating film, thereby to introduce a capturing potential at least near an interface between said one of the source/drain regions and the surface semiconductor layer in the buried insulating film side.

10 Claims, 6 Drawing Sheets

METHOD FOR STABILIZING SOI SEMICONDUCTOR DEVICE AND SOI SEMICONDUCTOR DEVICE

CROSS-REFERENCE TO RELATED APPLICATION

This application is related to Japanese application No. HEI 11(1999)-216108 filed on Jul. 30, 1999, whose priority is claimed under 35 USC § 119, the disclosure of which is incorporated by reference in its entirety.

BACKGROUND OF THE INVENTION

1. Field of the Invention

The present invention relates to a method for stabilizing a semiconductor device of SOI (Semiconductor On Insulator) structure and an SOI semiconductor device stabilized by the method.

2. Description of Related Art

As portable devices have come into wide use, development of LSIs capable of working for a longer time with a single battery power source is highly demanded. Moreover, research and development of SOI-MOSFETs which are expected to operate at high speed and consume less electric power have been proceeding.

In general, reduction of leak current is necessary for realizing less power consumption of the SOI-MOSFETs. Electric power consumed in a stand-by state is as large as several hundred μA at the LSI level, which leads to a serious problem.

Taking a short channel SOI-NMOSFET as an example, operation principle thereof in the stand-by state will be explained with reference to FIGS. 10 and 11.

In the stand-by state of the SOI-NMOSFET, for example, a positive voltage is applied to a drain 4. Accordingly, electrons are drawn from a source 5 and travel to the drain 4 via a channel 11. At this time, the electrons travel through the fine channel 11 of SOI-NMOSFET into the vicinity of the drain where an electric field strength is high, thereby turning to a high energy state. Then the electrons arrived at the drain 4 bring about an impact ionization and generate electron-hole pairs. The electrons newly generated by the impact ionization flow into the drain 4, while holes 12 gather at a lower portion of a surface silicon layer 3 adjacent to the source 5, where potential is low.

A model of a leak current in this stand-by state is shown in an equivalent circuit of FIG. 11. According to FIG. 11, a floating body effect by the impact ionization can be mentioned as a main factor dominant over an off-leak current.

In other words, the electrons discharged from the source 5 become a current Ich. The electrons bring about the impact ionization in the vicinity of the drain 4 and are multiplied by a multiplication coefficient (M−1), thereby turning to a current Ii (a current caused by the electrons generated by the impact ionization). On the other hand, the holes discharged from the drain 4 accumulate at a body 13 (a lower portion of the surface silicon layer). The holes 12 accumulated at the body 13 raise a substrate potential Vbs, i.e., cause the floating body effect.

When the floating body effect is produced and the substrate potential Vbs rises, the threshold voltage Vth of a MOSFET decreases. As a result, a subthreshold current is more liable to flow through the channel 11.

Further, when the substrate potential Vbs rises, a parasitic bipolar effect increases. That is, in an NMOSFET, an NPN type bipolar structure is formed from the source/drain regions and the body 13 lying therebetween. Accordingly, the rise in the body potential causes the electrons to be easily taken out from the source 5, thereby increasing a current Ic flowing into the drain via the body or base of the NPN bipolar transistor. The current Ic flows together with the current Ich and further increase the impact ionization. Thus, the parasitic bipolar effect becomes a factor for a positive feedback with respect to the off-leak current (in FIG. 11, a current Ib is a current caused by the holes generated by the impact ionization and the parasitic bipolar effect, and β is the current gain of the parasitic bipolar effect).

In general, the off-leak current of the MOSFET shows a behavior as shown in FIG. 12.

When a voltage Vds between the drain and the source is small (region I), a threshold voltage of the SOI-NMOSFET controls the leak current.

Further, when the voltage Vds increases a little (region II), the increase in the voltage Vbs and back bias effect, become the dominant factor of the leak current. In short, the parasitic bipolar effect may be increased and the impact ionization may be generated, which increases further the leakage current (the region II).

When the voltage Vds increases further (region III), the impact ionization coupled with the positive feedback originated by the parasitic bipolar transistor, has more dominant effect, so that the leak current increases rapidly.

From the above, mentioned as measures for reduction of the off-leak current are,
1. increasing the threshold voltage,
2. suppressing the parasitic bipolar effect and
3. suppressing the impact ionization.

Conventionally, there have been made various proposals for reduction of the off-leak current. For example, IEEE. SSDM. Tech. Dig., pp627–630, 1995 has proposed a method for intentionally forming a defect in a crystal by Ar ion implantation into a body. The defect introduced by such a method serves as a capturing potential, shortens the life span of carriers and contributes toward suppression of the parasitic bipolar effect and the reduction of the off-leak current.

However, in such an implantation method of Ar ions, the crystal defect is formed in a surface silicon layer of a substrate having the SOI structure, thereby reducing a carrier mobility and a drive current of a transistor. Further, this method is problematic in terms of industrial application because it causes multiplication of fabrication processes and an increase in product costs.

Therefore, a technique which is attempted to introduce the capturing potential by utilizing an electric stress has been proposed (Japanese Unexamined Patent Publication No. HEI 9 (1997)-8259). According to this technique, as shown in FIG. 13, a support substrate 1 is maintained at a temperature of 100 to 200° C., a gate 6, a drain 4 and a source 5 are grounded and a positive voltage is applied to the support substrate 1. Thereby a defect 8 can be caused to be introduced to a channel region 7 by the electric stress. The defect 8 serves as the capturing potential of carriers and results in the reduction of the leak current in the stand-by state. Incidentally, the formation of the defect by the electric stress is checked by a charge bombing method.

However, in such a method as described above, the substrate must be heated up to around 200° C. and the electric stress is applied for several hours. Therefore it is inefficient and difficult to realize industrially. Further, the electric stress is also applied to the front channel region 9. So the defect are formed front channel region 9. Accordingly, the drive current of the transistor may possibly be lowered.

SUMMARY OF THE INVENTION

According to the present invention, there provides a method for stabilizing an SOI semiconductor device which comprises the steps of: providing an SOI semiconductor device constituted of an SOI substrate including a support substrate, a buried insulating film formed on the support substrate and a surface semiconductor layer formed on the buried insulating film, source/drain regions formed in the surface semiconductor layer and a gate electrode formed on the surface semiconductor layer between the source/drain regions with intervention of a gate insulating film; and applying an electric stress between the support substrate and one of the source/drain regions so that a back channel is formed in a side of the surface semiconductor layer to the buried insulating film, thereby to introduce a capturing potential at least near an interface between said one of the source/drain regions and the surface semiconductor layer in the buried insulating film side.

Further, the present invention provides an SOI semiconductor device stabilized by the above method.

In other words, the present invention has been achieved by developing a method for applying the electric stress based on a principle drastically different from that of the conventional techniques in view of the above problems. Thus, the present invention provides an effective method for stabilizing an SOI semiconductor device in which the capturing potential is introduced only to a suitable position in a short time (several seconds to several hundred seconds) without raising the substrate temperature, and a semiconductor device obtained by the method.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
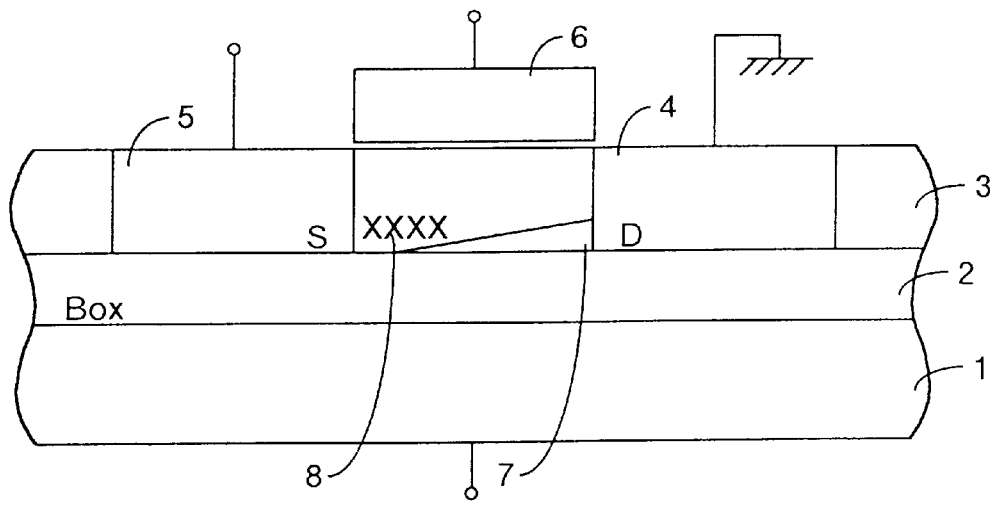
FIG. 1 is a schematic sectional view of a main part of an SOI semiconductor device for illustrating a method for stabilizing an SOI semiconductor device of the present invention.

An SOI semiconductor device used in the method for stabilizing the SOI semiconductor device of the present invention is mainly constituted of an SOI substrate in which a buried insulating film and a surface semiconductor layer are laminated in this order on a support substrate, source/drain regions formed in the surface semiconductor layer of the SOI substrate and a gate electrode formed on the surface semiconductor layer between the source/drain regions with the intervention of a gate insulating film.

Here, the SOI substrate is not particularly limited as long as it is formed of a material, in a structure and thickness ordinarily used. For example, BESOI and SIMOX (Separation by Implantation of Oxygen) semiconductor substrates are mentioned.

As the support substrate, various kinds of substrates are used, for example, semiconductor substrates of silicon, germanium and the like, compound semiconductor substrates of GaAs, InGaAs and the like, insulative substrates of sapphire, quartz, glass, plastic and the like.

The buried insulating film may be, for example, an $SiO_2$ film or an SiN film. The thickness of the buried insulating film can be appropriately adjusted in view of the characteristics of an intended semiconductor device, the magnitude of a voltage to be applied to an obtained semiconductor device for use and the like, but may be about 50 to 500 nm, for example.

The surface semiconductor layer is a thin semiconductor layer which serves as an active layer for forming a transistor and can be formed of a thin film of a semiconductor such as silicon or germanium, or a compound semiconductor such as GaAs or InGaAs. Among them, a thin film of silicon is preferable. In view of the characteristics of a semiconductor device to be obtained, the thickness of the surface semiconductor layer can be appropriately adjusted to about 30 to 200 nm depending on, for example, various parameters such as a junction depth of source/drain regions of a transistor, a depth of a channel region formed on a surface of the surface semiconductor layer and impurity concentration. These parameters will be explained later. Further, the surface semiconductor layer is provided with the source/drain regions and the channel region as described later. Therefore it is suitable to set the impurity concentration (for example, N-type impurities such as phosphorus or arsenic, or P-type impurities such as boron) in the surface semiconductor layer to about $1\times10^{15}$ to $1\times10^{18}$ atoms/cm$^3$, for example, so that the concentration corresponds to a threshold value of the semiconductor device to be obtained.

The source/drain regions formed in the surface semiconductor layer are preferably formed to have a junction depth equal to the thickness of the surface semiconductor layer. An impurity in the source/drain regions is not particularly limited to any type and may be of N-type or of P-type. Also an impurity concentration is not particularly limited. For example, an N-type impurity may be contained in an amount of about $1\times10^{20}$ to $1\times10^{21}$ atoms/cm$^3$. Further, the source/drain regions may have an LDD structure.

The gate insulating film and the gate electrode formed on the surface semiconductor layer between the source/drain regions are not particularly limited as long as they are made of a material in a thickness commonly employed for a semiconductor device. For example, the gate insulating film can be made of a silicon oxide film, a silicon nitride film or a laminated film thereof in a thickness of about 3 to 10 nm. The gate electrode can be made of polysilicon; suicides of refractory metals such as W, Ta, Ti and Mo; polycides comprised of these silicides (for example, MoSi$_2$ and WSi$_2$) and polysilicon; and other metals in a thickness of about 150 to 300 nm. Further, the gate electrode may have sidewall spacers of an insulating film, taking a lateral diffusion of the impurity for forming the source/drain regions into consideration.

Using the above-described SOI semiconductor device, an electric stress is applied between the support substrate and one of the source/drain regions. Specifically, in the case of an NMOS where the drain is grounded, a voltage of about 1 to 5V (2.5 to 3.5V) and a voltage of about 5 to 20V are applied to the source and the substrate, respectively. Where the source is grounded, a voltage of about 1 to 5V (2.5 to 3.5V) and a voltage of about 5 to 20V are applied to the drain and the substrate, respectively. At the application of the electric stress in both the cases where either the source or the drain is grounded, a voltage of about −0.1 V to about −0.8, i.e., about −0.5V is applied to the gate for maintaining the surface in a slightly accumulated state so that a surface channel is not formed. Further, in the case of a PMOS where the drain is grounded, a voltage of about 2.5 to 3.5V and a voltage of about −5 to −20V are applied to the source and the substrate, respectively. Where the source is grounded, a voltage of about 2.5 to 3.5 V and a voltage of about −5 to −20V are applied to the drain and the substrate, respectively. Similarly to the cases of NMOS, at the application of the electric stress in both the cases where either the source or the drain is grounded, a voltage of about 0.1 V to about 0.8, i.e., about 0.5V is applied to the gate so as to avoid the formation of a surface channel.

For the application of the electric stress as described above, the substrate temperature is preferably close to room temperature (about 30° C.). In the method of the present invention, however, it is not necessary to control rigidly the substrate temperature since the application of the electric stress in the method of the present invention does not involve an increase in the substrate temperature.

The electric stress is applied for about several seconds to several hundred seconds, particularly about 10 seconds to 500 seconds. For applying the electric stress, the above-described voltage application for the above-described period of time may be conducted once or plural times, or voltage application may be done with changing the pattern of the above-described voltage applications. In view of simplification of the operation, it is preferable to conduct only one application of a desired voltage for a desired period of time.

By applying the electric stress as described above, a back channel can be formed on a side of the surface semiconductor layer to the buried insulating film, with the surface semiconductor layer, the buried insulating film and the support substrate regarded as an active layer, a gate insulating film and a gate electrode, respectively. Thereby, a capturing potential is introduced at least in the vicinity of an interface between one of the source/drain regions and the surface semiconductor layer on the buried insulating film side.

The capturing potential may be introduced to the entire surface of the surface semiconductor layer on its buried insulating film side.

In the SOI semiconductor device of the present invention, the leak current in the stand-by state can be reduced because the capturing potential is introduced only in a desired position by the above method. Further, by a single application of the electric stress, the leak current in both of the forward and backward directions can be also reduced.

Hereinafter, the method for stabilizing an SOI semiconductor device and an example of the SOI semiconductor device will be detailed with reference to the drawings.

As shown in FIG. 1, used was an NMOSFET comprises an SOI substrate including a silicon substrate 1, a buried insulating film 2 of about 1000 Å thick and a surface silicon layer 3 of about 577 Å thick formed on the silicon substrate 1, a drain 4 and a source 5 formed in the surface silicon layer 3, and a gate electrode 6 formed on the surface silicon layer 3 with the intervention of a gate insulating film.

The drain 4 of the NMOSFET was grounded and voltages of 2.5V and 5.0V were applied to the source 5 and the substrate 1, respectively. A period of applying a stress was set to 1 to 300 seconds. A substrate temperature at this time was about 20 to 30° C. According to this, a back channel 7 was formed in a side of the surface semiconductor layer 3 to the buried insulating film 2. Thereby, a capturing potential 8 was introduced near an interface between the source 5 and the surface semiconductor layer 3 in the buried insulating film side.

Figure 2:
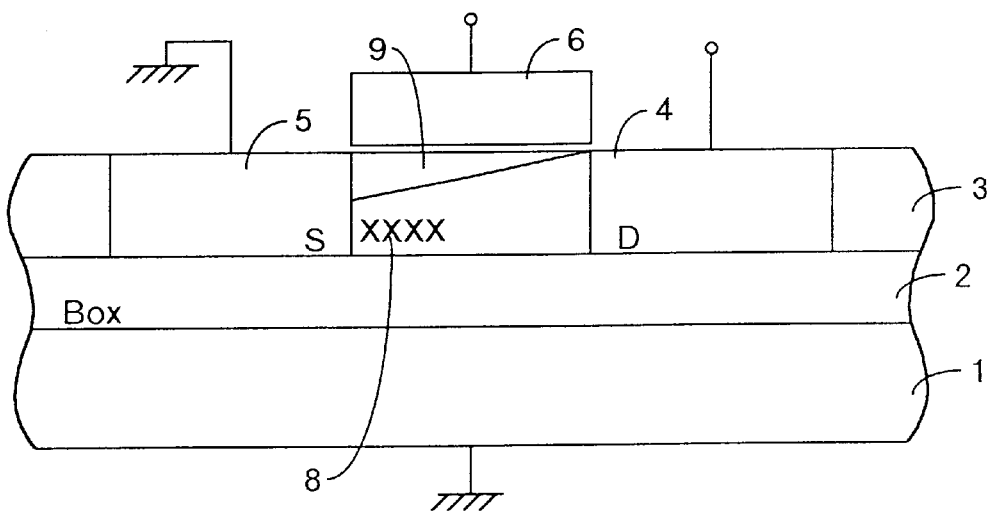
FIG. 2 is a schematic sectional view of a main part of the SOI semiconductor device for illustrating an operation when a bias voltage is applied in a forward direction to the stabilized SOI semiconductor device of FIG. 1.
Figure 3:
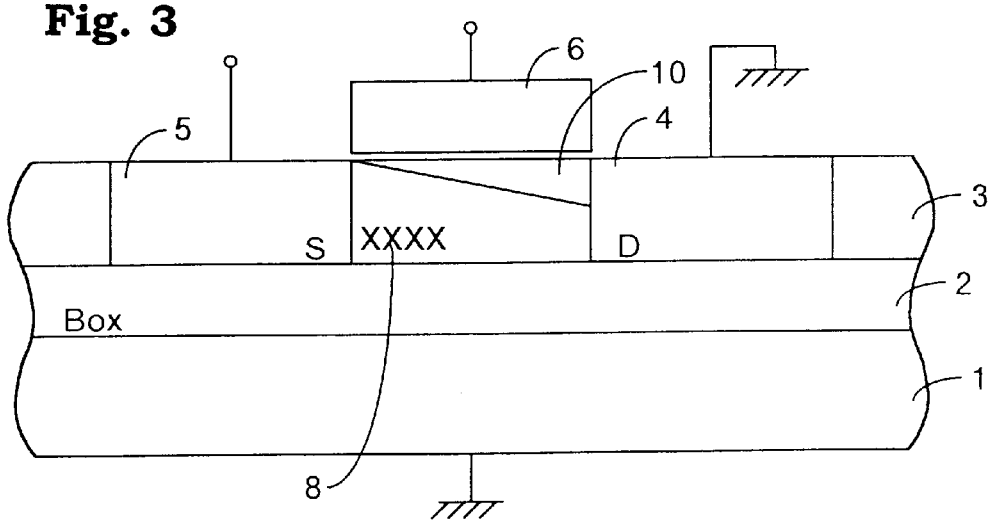
FIG. 3 is a schematic sectional view of a main part of the SOI semiconductor device for illustrating an operation when the bias voltage is applied in a backward direction to the stabilized SOI semiconductor device of FIG. 1.

In this semiconductor device, effects by the application of the electric stress were evaluated by conducting an ordinary voltage application for forming a front channel. This evaluation was conducted with respect to the case of a forward bias voltage where a positive voltage was applied to the drain 4 and the source 5 and the silicon substrate 1 were grounded to serve as a GND potential as shown in FIG. 2, and the case of a backward bias voltage where a positive voltage was applied to the source 5 and the drain 4 and the silicon substrate 1 were grounded to serve as a GND potential as shown in FIG. 3.

Figure 4:
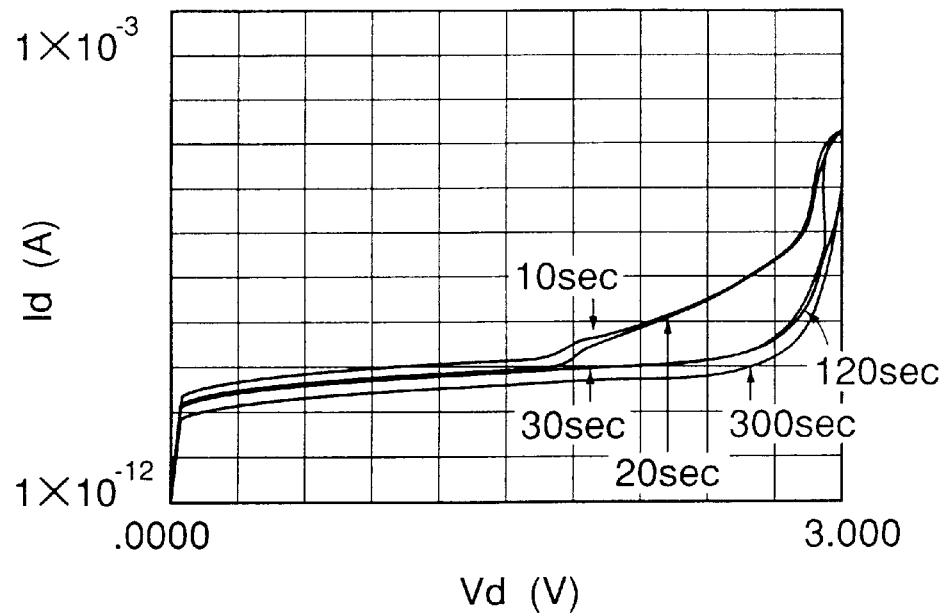
FIG. 4 is a graph showing a variation in a leak current with respect to a period of applying an electric stress when the bias voltage is applied in the forward direction to the SOI semiconductor device of FIG. 1.
Figure 5:
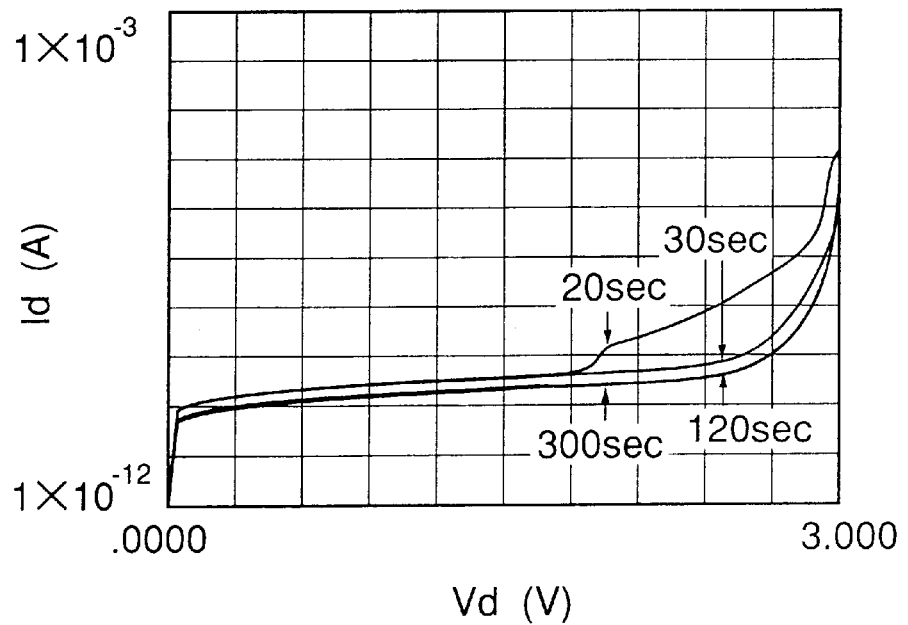
FIG. 5 is a graph showing a variation in the leak current with respect to a period of applying the electric stress when the bias voltage is applied in the backward direction to the SOI semiconductor device of FIG. 1.

The results are shown in FIGS. 4 and 5.

Figure 12:
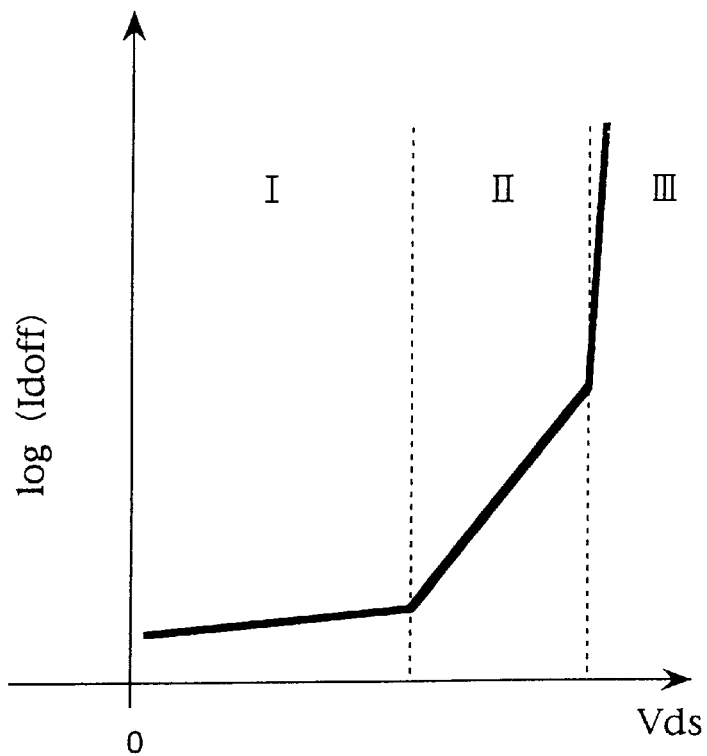
FIG. 12 is a graph illustrating a behavior of the leak current in a semiconductor device.
Figure 13:
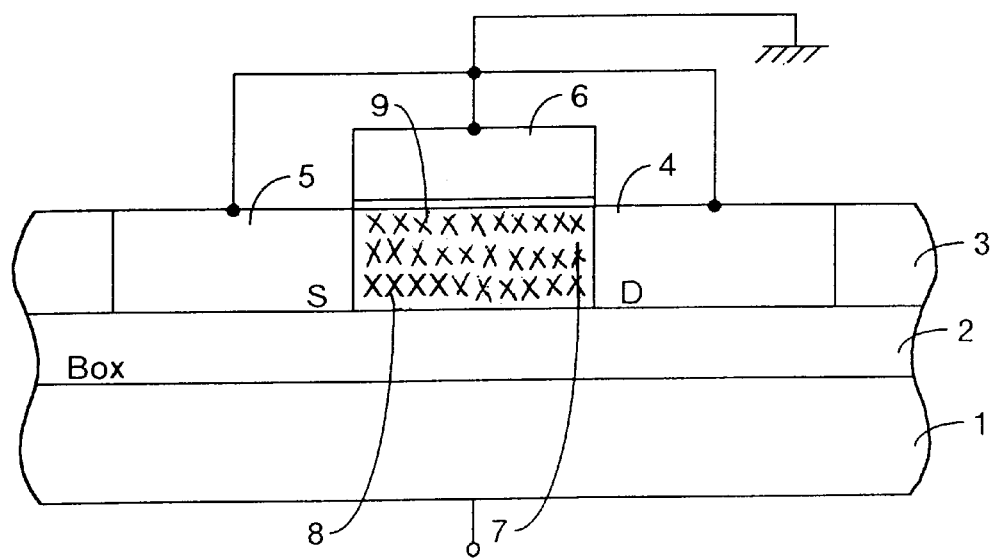
FIG. 13 is a schematic sectional view of a main part of an SOI semiconductor device for illustrating a conventional method for stabilizing an SOI semiconductor device.

FIG. 4 shows a relationship of an off-leak current to a voltage Vds applied between the drain and the source under a forward biased state in a semiconductor device in which the electric stress was applied for 10, 20, 30, 120 and 300 seconds. As the period of time of applying the electric stress increases, the leak current in regions I and II shows a decrease as illustrated in FIG. 12. In particular, the decrease in the leak current in the region II is remarkable.

FIG. 5 shows a relationship of the off-leak current to the voltage Vds applied between the drain and the source under a backward biased state in a semiconductor device in which the electric stress was applied for 20, 30, 120 and 300 seconds. As the period of time of applying the electric stress increases, reduction of the leak current similar to the results shown in FIG. 4 is observed.

Figure 6:
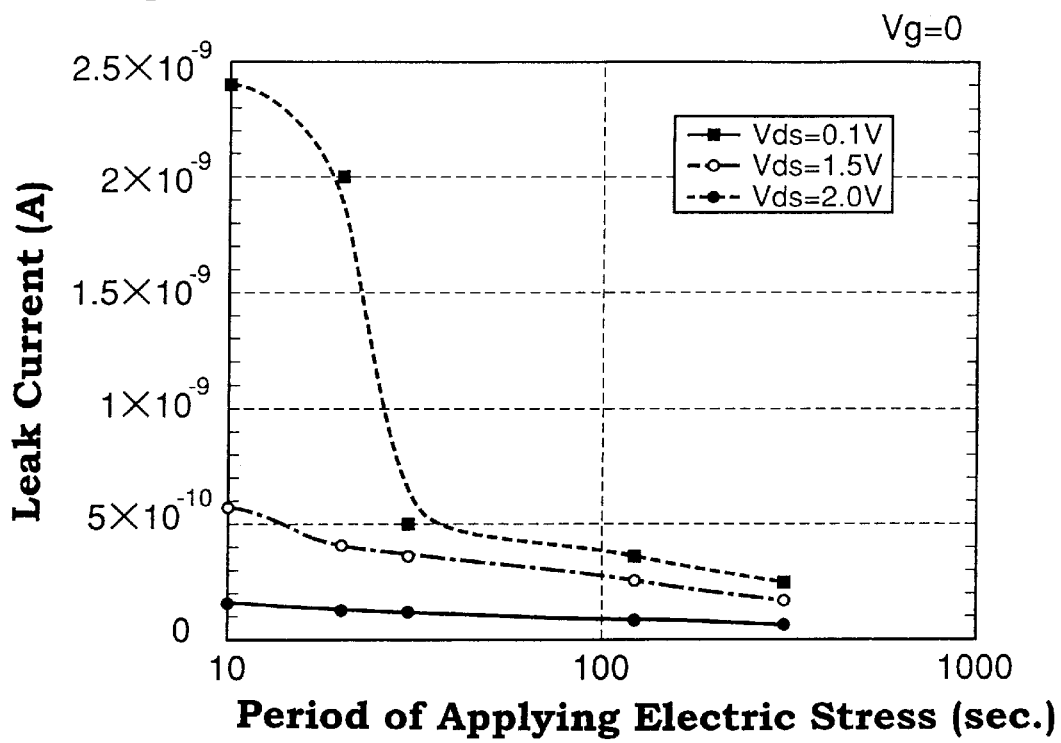
FIG. 6 is a graph showing a variation in the leak current with respect to a period of applying the electric stress when the bias voltage is applied in the forward direction to the SOI semiconductor device of FIG. 1.
Figure 7:
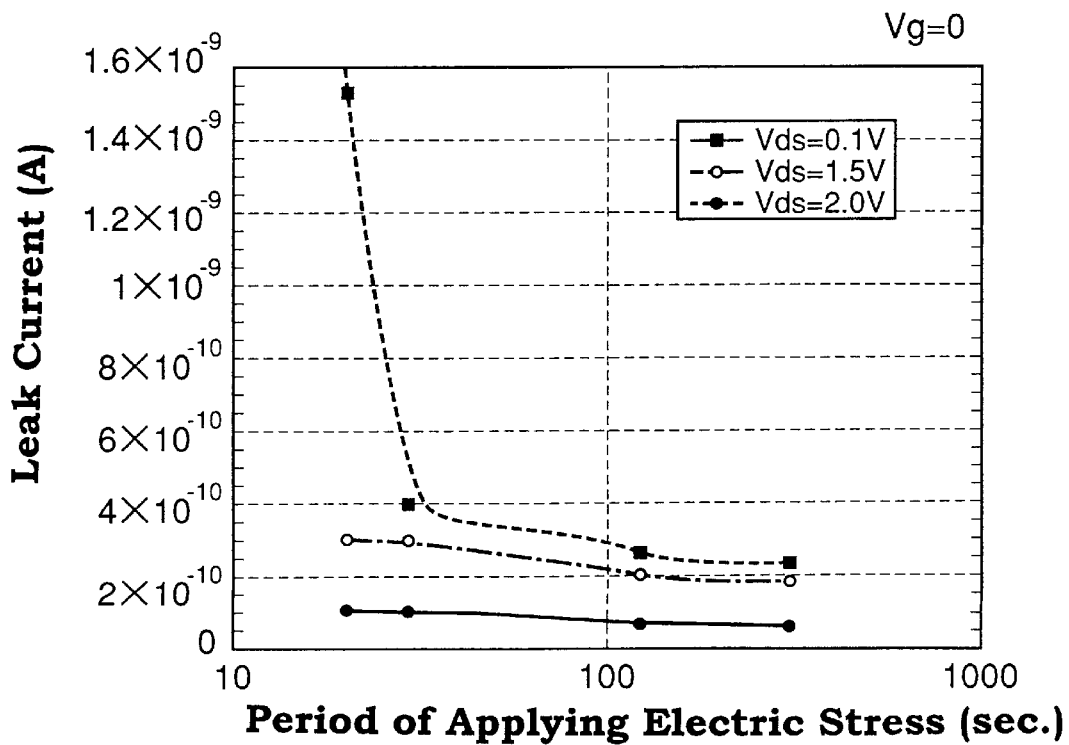
FIG. 7 is a graph showing a variation in the leak current with respect to a period of applying the electric stress when the bias voltage is applied in the backward direction to the SOI semiconductor device of FIG. 1.

According to these results, FIGS. 6 and 7 show the relationship between the leak current and the application period of the electric stress in the cases where the forward and backward bias voltages are applied, respectively.

FIGS. 6 and 7 show that the reduction of the leak current is observed with the increase in the application period of the electric stress in both the cases of the forward and backward biased states, respectively.

That is, a body potential is usually raised by impact ionization caused by a voltage applied between the drain and the source in the stand-by state (a gate voltage is zero). According to the increase in the body potential, electrons are injected from the source 5 to the drain 4 (a bipolar effect). In the present invention, however, the electric stress is applied as described above and the capturing potential 8 is introduced to a lower portion of an interface between the source 5 and the surface silicon layer 2. The capturing potential 8 serves as a positive fixed charge and captures the injected electrons, thereby reducing the number of the effective injected electrons. Whether a positive voltage is applied to the drain or the source, the electrons are captured in both the cases by this phenomenon. Therefore, the leak current can be effectively reduced by a single application of the electric stress as in the present invention, even if a bidirectional voltage is applied to an actual circuit.

Figure 8:
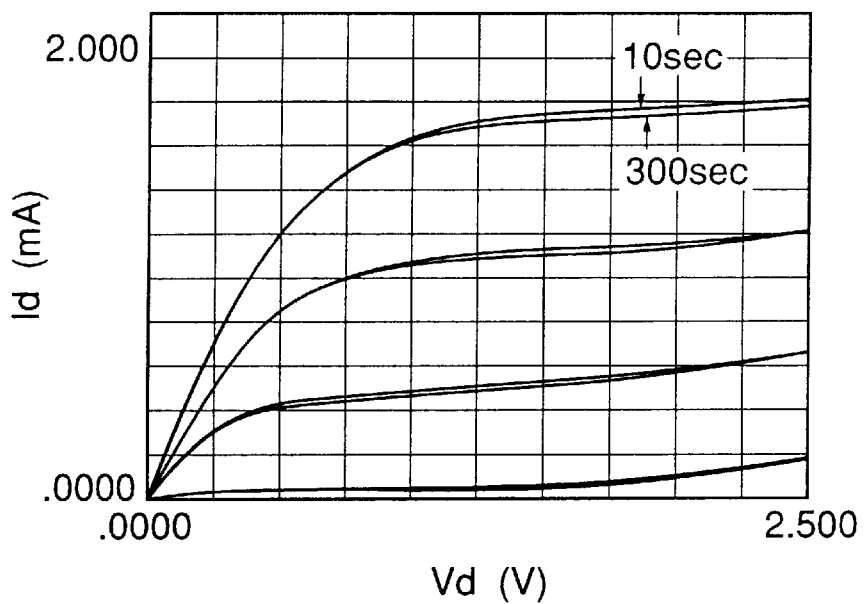
FIG. 8 is a graph showing a variation in a drive current measured as shown in FIG. 2 after applying the electric stress as shown in FIG. 1 to the SOI semiconductor device of FIG. 1.
Figure 9:
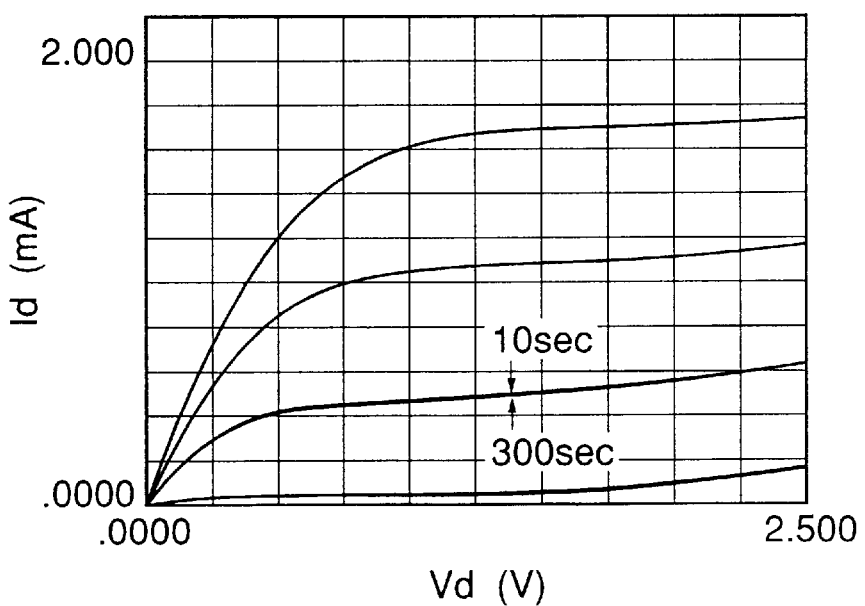
FIG. 9 is a graph showing a variation in the drive current measured as shown in FIG. 3 after applying the electric stress as shown in FIG. 1 to the SOI semiconductor device of FIG. 1.
Figure 10:
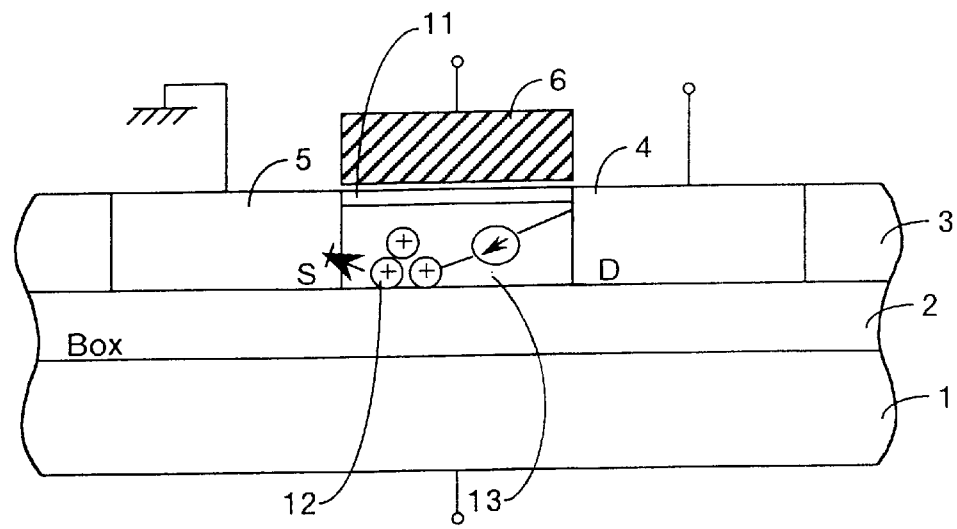
FIG. 10 is a view illustrating an operation principle of a conventional short channel SOI semiconductor device in a stand-by state.
Figure 11:
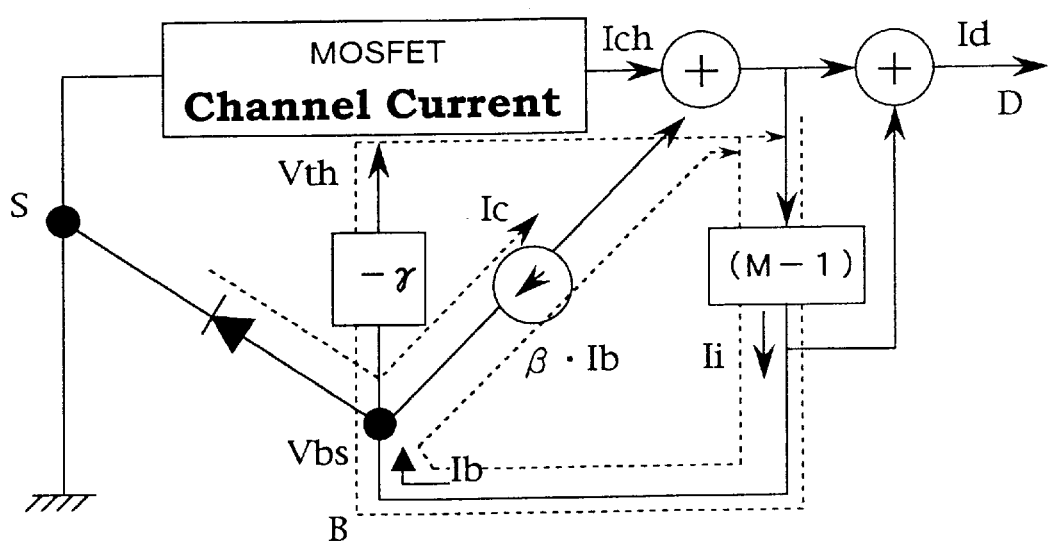
FIG. 11 is an equivalent circuit diagram illustrating current flow in the semiconductor device of FIG. 10 in a stand-by state.

Further, variation in a drive current in the cases where the forward and backward bias voltages were individually applied was determined, respectively. Then, as shown in FIGS. 8 and 9, reduction of the drive current was hardly observed. This indicates that the capturing potential was introduced only to a desired position without generating any defects on the front surface of the surface silicon layer by selecting appropriate application conditions of the electric stress.

Still further, according to the present invention, the leak current in the stand-by state can be reduced in a simple method because it is not necessary to heat the substrate at the application of the electric stress.

According to the present invention, in a semiconductor device which comprises an SOI substrate including a support substrate, a buried insulating film, and a surface semiconductor layer having source/drain regions formed therein, the buried insulating film and the surface semiconductor layer being formed on the support substrate, and a gate electrode formed on the surface semiconductor layer between the source/drain regions with the intervention of a gate insulating film, an electric stress is applied between the support substrate and one of the source/drain regions to form a back channel in a side of the surface semiconductor layer to the buried insulating film. Thereby, a capturing potential is introduced at least near an interface between said one of the source/drain regions and the surface semiconductor layer in the buried insulating film side. Accordingly, the parasitic bipolar effect is supressed, decrease in the threshold voltage and the impact ionization are suppressed, and the leak current in the stand-by state is reduced without decreasing the drive current by a simple, easy and practical method.

What is claimed is:

1. A method for stabilizing an SOI semiconductor device which comprises the steps of:

providing an SOI semiconductor device constituted of an SOI substrate including a support substrate, a buried insulating film formed on the support substrate and a surface semiconductor layer formed on the buried insulating film, source/drain regions formed in the surface semiconductor layer and a gate electrode formed on the surface semiconductor layer between the source/drain regions with intervention of a gate insulating film; and applying an electric stress between the support substrate and one of the source/drain regions so that a back channel is formed in a side of the surface semiconductor layer to the buried insulating film, thereby to introduce a capturing potential at least near an interface between said one of the source/drain regions and the surface semiconductor layer in the buried insulating film side.

2. The method according to claim 1, wherein a period of time of applying the electric stress is adjusted so that the capturing potential is introduced to the entire buried insulating film side of the surface semiconductor layer.

3. The method according to claim 1, wherein the electric stress is applied by setting one of the source/drain regions at a ground potential and the other at a positive potential.

4. The method according to claim 3, wherein the positive potential is 1 V to 5 V.

5. The method according to claim 3, wherein the electric stress is applied by further setting the support substrate at a positive potential in the case of an N channel semiconductor device or at a negative potential in the case of an P channel semiconductor device.

6. The method according to claim 5, wherein the positive potential is 5 V to 20 V and the negative potential is −5 V to −20 V.

7. The method according to claim 3, wherein the electric stress is applied by further setting the gate electrode at a negative potential in the case of an N channel semiconductor device or at a positive potential in the case of an P channel semiconductor device so that a surface channel is not formed.

8. The method according to claim 5, wherein the negative potential is −0.1 V to −0.8 V and the positive potential is 0.1 V to 0.8 V.

9. The method according to claim 1, wherein the electric stress is applied for about several seconds to several hundred seconds.

10. The method according to claim 9, wherein the electric stress is applied for about 10 seconds to 500 seconds.

* * * * *